United States Patent [19]

Nakamura et al.

[11] Patent Number: 5,288,571
[45] Date of Patent: Feb. 22, 1994

[54] PHOTORESIN PRINTING PLATE FOR USE IN PRINTING A CORRUGATED BOARD

[75] Inventors: Shohei Nakamura, Fuji; Kuniaki Minonishi, Yokohama, both of Japan

[73] Assignee: Asahi Kasei Kogyo Kabushiki Kaisha, Osaka, Japan

[21] Appl. No.: 841,212

[22] Filed: Feb. 27, 1992

Related U.S. Application Data

[63] Continuation of Ser. No. 464,604, Jan. 12, 1990, abandoned, which is a continuation of Ser. No. 100,181, Sep. 23, 1987, abandoned.

[30] Foreign Application Priority Data

Oct. 2, 1986 [JP] Japan ................. 61-233264

[51] Int. Cl.⁵ .................................. G03C 3/00
[52] U.S. Cl. ............................... 430/18; 430/284; 430/306; 430/309; 522/92; 522/93; 522/96
[58] Field of Search ............ 430/284, 18, 306, 309; 522/92, 93, 96

[56] References Cited

U.S. PATENT DOCUMENTS

| | | | |
|---|---|---|---|
| 2,893,320 | 7/1959 | Jones | 101/492 |
| 3,782,961 | 1/1974 | Takahashi et al. | 96/115 R |
| 3,948,665 | 3/1976 | Richter et al. | 430/284 X |
| 3,960,572 | 6/1976 | Ibata et al. | 96/115 P |
| 4,006,024 | 2/1977 | Ibata et al. | 96/115 R |
| 4,057,431 | 11/1977 | Finelli et al. | 96/115 R |
| 4,137,081 | 1/1979 | Pohl | 96/87 R |
| 4,174,307 | 11/1979 | Rowe | 522/96 |
| 4,192,684 | 3/1980 | Gensho et al. | 430/284 |
| 4,197,130 | 4/1980 | Nakamura et al. | 430/286 |
| 4,202,696 | 5/1980 | Takahashi et al. | 430/306 |
| 4,266,005 | 5/1981 | Nakamura et al. | 430/271 |
| 4,272,608 | 6/1981 | Proskow | 430/281 X |
| 4,292,150 | 9/1981 | Farber et al. | 430/302 X |
| 4,320,188 | 3/1982 | Heinz et al. | 430/281 |
| 4,358,354 | 11/1982 | Iida et al. | 204/159.14 |
| 4,430,417 | 2/1984 | Heinz et al. | 430/281 X |
| 4,446,220 | 5/1984 | Proskow | 430/286 |
| 4,603,058 | 7/1986 | Adams | 430/309 X |
| 4,716,094 | 12/1987 | Minonishi et al. | 430/306 X |

FOREIGN PATENT DOCUMENTS

| | | |
|---|---|---|
| 0154994 | 9/1985 | European Pat. Off. |
| 2140306 | 9/1972 | Fed. Rep. of Germany |
| 47538 | 6/1973 | Japan |
| 32702 | 3/1974 | Japan |
| 33702 | 3/1974 | Japan |
| 33703 | 3/1974 | Japan |
| 109104 | 10/1974 | Japan |
| 110402 | 10/1974 | Japan |
| 7603 | 1/1975 | Japan |
| 19504 | 3/1975 | Japan |
| 35481 | 9/1978 | Japan |
| 24102 | 2/1979 | Japan |
| 41202 | 12/1979 | Japan |
| 3686 | 1/1982 | Japan |
| 2118563 | 11/1983 | United Kingdom |

*Primary Examiner*—Marion E. McCamish
*Assistant Examiner*—Mark A. Chapman
*Attorney, Agent, or Firm*—Birch, Stewart, Kolasch & Birch

[57] ABSTRACT

A photoresin printing plate having a Shore A hardness at 20° C. of 25 to 60, an impact resilience at 20° C. of 35% or more as measured by a falling ball method and a surface tack at 20° C. of 40 g/cm or less has been found not only to be capable of providing prints having an image of high precision but also to be capable of releasing the paper dust or the like, which has adhered to the printing plate, in a short period of time during the printing operation, so that it did not become necessary to interrupt the printing operation in order to clean the printing plate, which leads to an efficient production of the prints.

21 Claims, 1 Drawing Sheet

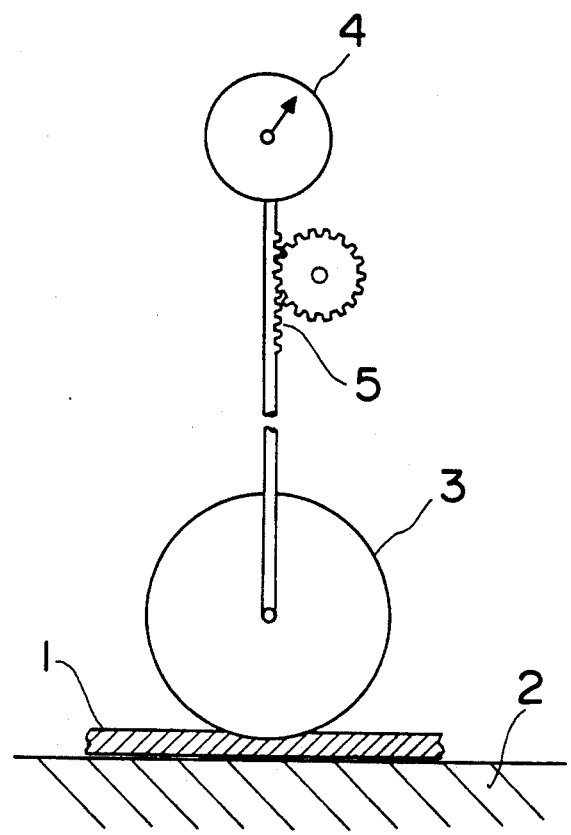

PHOTORESIN PRINTING PLATE FOR USE IN PRINTING A CORRUGATED BOARD

This application is a continuation of application Ser. No. 07/464,604 filed on Jan. 12, 1990, now abandoned, which is a continuation application of Ser. No. 07/100,181 filed on Sep. 23, 1987 now abandoned.

BACKGROUND OF THE INVENTION

1. Field of the Invention

The present invention relates to a photoresin printing plate for use in printing a corrugated board. More particularly, the present invention is concerned with a photoresin printing plate for use in printing a corrugated board, which has a Shore A hardness at 20° C. of 25 to 60, an impact resilience at 20° C. of 35 % or more as measured by a falling ball method and a surface tack at 20° C. of 40 g/cm or less and which is capable of providing prints having high precision of image with a high operation efficiency, that is, without necessity of interrupting the printing operation in order to clean the printing plate.

2. Description of the Prior Art

Rubber printing plates for use in printing a corrugated board have previously been used. However, it has not been possible to print a fine image with any degree of high precision using a rubber printing plate. In the recent years, it has become necessary for the image printed on a corrugated board to be finer. Accordingly, photoresin printing plates which are capable of providing a print having a fine image with high precision have been taking the place of rubber printing plates. Especially in the type of printing which requires a high degree of precision, such as bar code printing, the use of a photoresin printing plate is indispensable because a rubber printing plate simply cannot satisfy the requirement of high precision.

In printing a corrugated board, the following points must be taken into consideration. First, a corrugated board on which the image is to be printed does not always have a flat surface. Second, in general, in the field of printing, the uniform transfer of the ink can be achieved under a high printing pressure. However, in printing a corrugated board, the ink must be uniformly transferred onto the surface of the corrugated board under a low printing pressure because too high a printing pressure causes the flute of a corrugated material provided between the liners of the corrugated board to be deformed. This leads to a lowering of the strength of the corrugated board as a whole. In view of the above-mentioned points, a soft printing plate having a Shore A hardness of 25 to 60 is generally used for printing a corrugated board.

However, the use of a photoresin printing plate having such a low degree of hardness for printing a corrugated board involves a serious practical problem. In a printing operation, paper dust or the like present on the surface of the corrugated board to be printed sometimes adhere to the surface of the printing plate. In the case of a soft photoresin printing plate as mentioned above, once such an adhesion occurs, the paper dusts or the like cannot easily be released from the surface of the printing plate, making it necessary to interrupt the operation of the printing machine in order to clean the printing plate. This inevitably lowers the productivity and the yield of the prints.

For example, U.S. Pat. No. 3,960,572 discloses an unsaturated polyurethane type photosensitive resin composition for use in preparing a printing plate. In preparing the composition, a polyether diol and a polyester diol are used in an amount ratio of 1:4 to 3:1. This reference, however, does not disclose the capability of the printing plate to release the paper dust or the like which has adhered to the surface of the plate. The printing plate disclosed in this reference has a low impact resilience as measured by a falling ball method and, therefore, has a poor capability for releasing such types of dust or the like, as will be later discussed. In this connection, it is to be noted that although the reference discloses values of the impact resilience exceeding 35%, the indicated values of the impact resilience are those which are obtained by the measurement in accordance with the Dunlop method as substantiated by the reproduction of the examples in the reference. The value of the impact resilience of a printing plate as measured by the Dunlop method is usually about twice as high as the value of the impact resilience of the same printing plate as measured by a falling ball method. Therefore, in terms of the impact resilience as measured by a falling ball method, as is the case with the present invention, the reference does not disclose a value of 35% or more.

Further, U.S. Pat. No. 3,782,961 discloses a photosensitive resin composition for use in producing a flexographic printing plate which is suitable for printing packaging materials, including a corrugated board. The composition comprises a specific polyurethane as the prepolymer. However, this reference provides no disclosure as to the capability of the printing plate prepared from the composition, to release paper dust or the like, which has adhered to the surface of the plate.

Various proposals have heretofore been made for solving the above-mentioned problem. However, such proposals deal solely with a method for removing the surface tack of a photoresin printing plate, based on the assumption that the capability of a printing plate to release the paper dust or the like, which has adhered to the surface of the plate, depends mainly on the surface tack of the printing plate, as well as a method for improving the ease of handling of the printing plate (see, for example, U.S. Pat. No. 4,202,696).

By removing the surface tack of the photoresin printing plate in accordance with the proposed, methods, the capability of a photoresin printing plate to release the paper dust or the like, which has adhered to the surface of the plate is somewhat improved. However, these methods still have a problem that once paper dust or the like has adhered to the surface of a printing plate, more than several tens of prints are necessarily produced before the paper dust or the like is self-released from the printing plate and that, therefore, it is still necessary to interrupt the printing operation to clean the printing plate.

SUMMARY OF THE INVENTION

The present inventors have made extensive and intensive studies with a view to developing a photoresin printing plate for use in printing a corrugated board, which is free from the above-mentioned drawbacks. As a result, the present inventors have found that a photoresin printing plate having a Shore A hardness, a surface tack and an impact resilience respectively in specific ranges has the desired excellent properties. Based on this finding, the present invention has been completed.

An object of the present invention is to provide a photoresin printing plate having excellent properties as a printing plate for use in printing a corrugated board, that is, a printing plate which makes it possible to carry out printing of a corrugated board without interrupting the operation of the printing machine to clean the printing plate during the printing operation, thereby leading to an efficient production of prints having an image of high precision.

The foregoing and other objects of the present invention will be apparent to those skilled in the art from the following detailed description and appended claims, taken in connection with the accompanying drawing.

BRIEF DESCRIPTION OF THE DRAWINGS

The accompanying drawing is a schematic diagram of an apparatus for determining the surface tack of a printing plate.

DETAILED DESCRIPTION OF THE INVENTION

According to the present invention, there is provided a photoresin printing plate for use in printing a corrugated board, which has a Shore A hardness at 20° C. of 25 to 60, an impact resilience at 20° C. of 35% or more as measured by a falling ball method and a surface tack at 20° C. of 40 g/cm or less.

The printing plate according to the present invention is required to have a Shore A hardness of 25 to 60 at 20° C. A printing plate having a Shore A hardness at 20° C. of less than 25 can readily provide a uniform ink coating on the corrugated board but is disadvantageous in that the relief of such a printing plate is likely to be distorted even under low printing pressure. Thus, the printed image would be caused to be thick, leading to a problem that characters, etc., which are printed on the corrugated board would be defaced and become illegible. On the other hand, a printing plate having a Shore A hardness of more than 60 requires a large printing pressure for providing a uniform ink coating on the corrugated board. Thus the flute of the corrugated material would become deformed, thereby causing a lowering of the strength of the corrugated board. From the viewpoint of attaining a good balance between prevention of the thickening of the printed image which causes the characters, etc., to become defaced and illegible and the capability for providing a uniform ink coating on the corrugated board at such a moderate pressure that the flute of the corrugated material of the corrugated board is not deformed, the printing plate preferably has a Shore A hardness of 35 to 50.

The printing plate of the present invention is also required to have an impact resilience at 20° C. of 35% or more as measured by a falling ball method and a surface tack at 20° C. of 40 g/cm or less. If either the impact resilience or the surface tack is outside the above-mentioned respective ranges, the capability of the printing plate to release the paper dust or the like, which has adhered to the surface of the plate is lowered. Thus, it would become necessary to interrupt the printing operation in order to clean the printing plate.

According to the present invention, the impact resilience(%) is measured by a falling ball method at 20° C. as follows. Onto a sample plate having a thickness of 7 mm, an iron ball having a diameter of 8 mm is allowed to fall by gravity from the height of 30 cm above the plate. Then, the height above the plate (x; cm) reached by the ball which has bounced from the plate is measured. The impact resilience (%) is determined by the following formula.

$$\text{impact resilience (\%)} = \frac{x}{30} \times 100$$

In the measurement, any surface tack of the sample plate affects the value of the impact resilience measured. Therefore, if the sample plate has any surface tack, the surface tack is removed before carrying out the measurement by covering the entire surface of the printing plate onto which an iron ball is dropped with a powder such as talc and then lightly wiping the surface of the plate with a piece of gauze in order to remove the excess powder.

Further, according to the present invention, the surface tack of a printing plate is measured in terms of the value of the stress required to separate an aluminum wheel which has been forced onto the surface of a sample plate. The particulars of the method for measuring the surface tack as mentioned above are described below with reference to the drawing. In the drawing, there is shown a schematic diagram of an apparatus for determining the surface tack of a printing plate. A printing plate 1 is attached to a level support 2 in such a manner that the relief face of the plate is directed upward. An aluminum wheel 3 of 13 mm in width and 50 mm in radius is brought into contact with the plain portion of the relief face of the plate. A load of 500 g is applied to the aluminum wheel and allowed to stand for 4 seconds. Then, the wheel is lifted upward by means of a gear 5 at a constant elevation speed of 30 mm/min until the plate is separated from the wheel. The value of the stress just before the separation of the wheel 3 from the plate 1 is measured using a push-pull gauge. The value of the surface tack is obtained by dividing the value as measured above by 1.3 [the width (cm) of the aluminum wheel].

The photoresin printing plate of the present invention having the above-mentioned properties may, for example, be prepared from a liquid photosensitive resin composition comprising, as essential components, (A) a prepolymer having at least one ethylenically unsaturated double bond in the molecule, (B) an ethylenically unsaturated compound and (C) a photopolymerization initiator. If necessary, the composition may optionally contain a stabilizer.

As the prepolymer having at least one ethylenically unsaturated double bond in the molecule [component (A)], there may be employed, for example, an unsaturated polyurethane, an unsaturated polyester, a mixture thereof or the like.

Examples of unsaturated polyurethanes includes those which are obtained by the reaction between a compound having at least two groups which each have an active hydrogen atom, such as a diol or a diamine, a compound having at least two isocyanate groups and a compound containing in the molecule thereof both a functional group having an active hydrogen atom and at least one ethylenically unsaturated double bond.

Examples of diols include a polyether diol such as polyethylene glycol, polypropylene glycol or polytetramethylene glycol; a polyester diol obtained by reacting a polyether diol mentioned above with a dicarboxylic acid compound such as adipic acid or succinic acid; a liquid polybutadiene having hydroxyl groups at both terminals of the molecule; a liquid styrene-butadiene copolymer having hydroxyl groups at both terminals of the molecule; and the like.

The number average molecular weight of a diol to be employed may preferably be in the range of from 700 to 5000. If the molecular weight of the diol is outside and less than the above-mentioned range, the density of the urethane bonds in the molecule of the prepolymer (A) becomes too high. This causes the impact resilience of a cured photosensitive resin composition containing the prepolymer to be too low, which would lead to difficulty in the obtainment of a photoresin printing plate having an impact resilience of 35% or more. On the other hand, if the molecular weight of the diol employed is outside and higher than the above-mentioned range, the tensile properties of the ultimate photoresin printing plate would be insufficient. From the viewpoint of attaining a good balance of the impact resilience and the tensile properties, the number average molecular weight of the diol is more preferably 1000 to 2500. The number average molecular weight of a diol is determined by measuring the hydroxyl number of the diol.

As the diol, a polyether diol is preferred to a polyester diol. This is because any ester linkage in the diol employed has a tendency to decrease the impact resilience of the ultimate photoresin printing plate. Further, the ester linkage would tend to be hydrolyzed by the action of water present in the air during storage of the printing plate, thereby deteriorating the properties of the printing plate. In the case where a polyester diol is employed, it is preferred to control the density of the ester linkages in the polyester diol so that the total number of the ester linkages and urethane bonds in a molecule per unit of the number average molecular weight of the polyester diol is 1/500 or less, or to use the polyester diol in combination with 25% by weight or more, based on the weight of the polyester diol used, of a polyether diol.

The use of polyethylene glycol as a part of the polyether diol for obtaining the unsaturated polyurethane to be contained in the photosensitive resin composition, permits the uncured portions of the photosensitive resin to be easily washed out with a developer, such as an aqueous solution of a surface active agent, after the photosensitive resin layer is image-wise exposed in the process of preparing a printing plate. However, the use of polyethylene glycol as the sole or a major component of the polyether diol would cause the water resistance of the ultimate printing plate to be poor. A printing plate having a poor water resistance is disadvantageous because, in printing a corrugated board, a water ink is mainly used. Therefore, if polyethylene glycol is used as a part of the polyether diol, the content thereof in the polyether diol component should be kept low, preferably 5 to 30% by weight based on the total weight of the polyether diol component. From the viewpoint of the water resistance of the printing plate, the use of polytetramethylene glycol as a reactant for producing the unsaturated polyurethane is most advantageous. Further, the use of polytetramethylene glycol as a reactant for producing the unsaturated polyurethane results in a printing plate having a high impact resilience and a low surface tack. Therefore, it is preferable that at least 20% by weight of the polyether diol component be comprised of polytetramethylene glycol. In this case, the polyether diol component may comprise, in combination, polytetramethylene glycol and one or more types of any other polyether diol compounds. Especially when polyethylene glycol is used as a part of the polyether diol component, the use of at least 20% by weight, based on the total weight of the polyether diol component, of polytetramethylene glycol in combination therewith is advantageous from the viewpoint of imparting sufficient water resistance to the printing plate. In view of the above-mentioned respective advantages of using polyethylene glycol and polytetramethylene glycol, it is more preferable that the polyether diol comprise at least 20% by weight, based on the total weight of the polyether diol component, of polytetramethylene glycol and 5 to 30%, based on the total weight of the polyether diol component, of polyethylene glycol.

Examples of diamines include a liquid polybutadiene having amino groups at both terminals of the molecule, hexanediamine and the like.

As the compound having at least two isocyanate groups, there may be mentioned, for example, tolylene diisocyanate, xylylene diisocyanate, hexamethylene diisocyanate, trimethylhexane diisocyanate and the like.

As the compound containing, in the molecule thereof, both at least one functional group having an active hydrogen atom and at least one ethylenically unsaturated double bond, there may be mentioned, for example, hydroxypropyl acrylate, hydroxypropyl methacrylate, hydroxyethyl acrylate, hydroxyethyl methacrylate, polypropylene glycol mono-acrylate, polypropylene glycol mono-methacrylate and the like.

In preparing an unsaturated polyurethane, it is preferred to use a compound having at least two groups which have an active hydrogen atom, a compound having at least two isocyanate groups and a compound containing, in the molecule thereof, both at least one functional group having an active hydrogen atom and at least one ethylenically unsaturated double bond, in such an amount ratio that the total number of the groups having an active hydrogen atom is greater than the total number of the isocyanate groups. By controlling the ratio of the number of the groups having an active hydrogen atom to the number of the isocyanate groups, unsaturated polyurethanes having desired number average molecular weights can be obtained.

It is preferable that the densities of the ester linkages, urea bonds and urethane bonds in an unsaturated polyurethane be 1/500 or less in terms of the number of the linkages and bonds in a molecule per unit of the number average molecular weight of the unsaturated polyurethane. This is because the presence of these linkages and bonds in the unsaturated polyurethane would have a tendency to lower the impact resilience of the ultimate printing plate. The densities of ester linkage, urea bond and urethane bond in the unsaturated polyurethane can be controlled at low levels respectively by using a diol etc., having a low density of ester linkage, by using a diamine having a high molecular weight and by using a diol having a high molecular weight.

The number average molecular weight of the unsaturated polyurethane may preferably be in the range of 8000 to 20,000. The use of an unsaturated polyurethane having a number average molecular weight outside and lower than the above-mentioned range results in an ultimate printing plate having too high a hardness and poor tensile properties, especially too low an elongation at break. Such a printing plate would be unsuitable for use in printing a corrugated board. This is because such an unsaturated polyurethane would have too low a number average molecular weight per double bond.

Moreover, the use of an unsaturated polyurethane having a number average molecular weight of less than 8000 in a photosensitive resin composition also has the following disadvantage. A printing plate for use in printing a corrugated board generally has a thickness of 4 to 7 mm. Therefore, in the process of preparing a printing plate for use in printing a corrugated board, a photosensitive resin layer having a thickness of 4 to 7 mm must first be formed from a photosensitive resin composition. However, a photosensitive resin composition containing an unsaturated polyurethane having such a low molecular weight as mentioned above would have a low viscosity and, therefore, would tend to flow during the formation of a photosensitive resin layer of the above-mentioned thickness, which would lead to difficulty in the obtainment of a printing plate having a uniform thickness. On the other hand, the use of an unsaturated polyurethane having a number average molecular weight of more than 20,000 in a photosensitive resin composition is also disadvantageous for the following reasons. First of all, a photosensitive resin composition containing an unsaturated polyurethane having such a high molecular weight would also have a viscosity which would be so high as to cause difficulties in the handling of the resin and in the formation of a layer thereof having a uniform thickness. Secondly, in washing out the uncured portions of the photosensitive resin layer with an aqueous developer after the photosensitive resin layer is image-wise exposed, part of the uncured photosensitive resin remains unremoved, if the above-mentioned unsaturated polyurethane having such a high molecular weight is used. The number average molecular weight of an unsaturated polyurethane is determined by osmometry.

The unsaturated polyester is obtained by the esterification of a diol and a dicarboxylic acid. As the diol, there may be mentioned, for example, polyethylene glycol, polypropylene glycol, polytetramethylene glycol and the like. As the dicarboxylic acid, there may be mentioned, for example, a saturated carboxylic acid such as adipic acid, succinic acid or isophthalic acid; an unsaturated carboxylic acid such as fumaric acid or maleic acid; or a mixture thereof. The use of fumaric acid or maleic acid as at least a part of the dicarboxylic acid results in an unsaturated polyester having at least one double bond in an intermediate portion of the molecule. Further, an unsaturated polyester having one or two ethylenically unsaturated double bonds respectively at one or both terminals of the molecule may be obtained by the use, in combination with the diol and the dicarboxylic acid, of acrylic acid, methacrylic acid, hydroxyethyl acrylate, hydroxyethyl methacrylate, hydroxypropyl acrylate, hydroxypropyl methacrylate, polypropylene glycol mono-acrylate, polypropylene glycol monomethacrylate or the like. Whatever combination of starting materials is employed for producing an unsaturated polyester, it is required that at least one of the starting materials have at least one ethylenically unsaturated double bond in the molecule. It is preferable that the density of any ester linkage in the unsaturated polyester be controlled at a low level because the presence of any ester linkage in the unsaturated polyester lowers an impact resilience of the ultimate printing plate.

As prepolymer (A), an unsaturated polyurethane is preferred to an unsaturated polyester because a printing plate having a higher printing resistance is obtained by the use of an unsaturated polyurethane than by the use of an unsaturated polyester.

As the ethylenically unsaturated compound [component (B)], there may be mentioned an acrylate or methacrylate, e.g. alkyl esters such as lauryl ester and stearyl ester, monoesters or diesters of polyethylene glycol and acrylic or methacrylic acid, monoesters or diesters of polypropylene glycol and acrylic or methacrylic acid, triesters of trimethylolpropane and acrylic or methacrylic acid or the like. In this connection, an acrylate is preferable to a methacrylate because the former gives a printing plate having a higher impact resilience than the latter. Therefore, it is preferred that at least a portion of the ethylenically unsaturated compound be acrylate. Further, an ethylenically unsaturated compound having a low density of ester linkage gives a printing plate having a high impact resilience and, therefore, may preferably be used. In addition, it is preferred that part of the ethylenically unsaturated compound (B) be a compound having at least two ethylenically unsaturated double bonds because the use of such a compound improves the tensile properties of the ultimate printing plate. However, since the use of a compound having at least two ethylenically unsaturated double bonds increases the hardness of the printing plate, the amount of such a compound to be used should be controlled so that a printing plate having the desired hardness is obtained. For this reason, it is preferred that the ethylenically unsaturated compound be a mixture of a compound having one ethylenically unsaturated double bond in the molecule and a compound having at least two ethylenically unsaturated double bonds in the molecule. In this case, the proportion of the ethylenically unsaturated compound having at least two ethylenically unsaturated double bonds in the molecule may preferably be in the range of from 1 to 20% by weight based on the total weight of the mixture. If the proportion of the ethylenically unsaturated compound having at least two ethylenically unsaturated double bonds is outside and lower than the above-mentioned range, the tensile properties of the ultimate printing plate is not improved. On the other hand, if the proportion of such a compound is outside and higher than the above-mentioned range, the hardness of the ultimate printing plate is increased so much that it becomes difficult to produce a printing plate having hardness in the range of the present invention.

There is no particular limitation with respect to the type of the photopolymerization initiator [component (C)] to be used in the present invention. Therefore, a photopolymerization initiator customarily used in conventional photosensitive resin compositions may be used. Specifically, ethers such as benzoin isopropyl ether, benzoin isobutyl ether, α-methylolbenzoin methylether and α-methylbenzoin methylether, 2,2-dimethoxy-2-phenylacetophenone, 2,2-diethoxyacetophenone, benzophenone, 2-ethylanthraquinone or the like may be used.

In addition, the photosensitive resin composition to be used in the present invention may optionally contain a stabilizer. As the stabilizer, there may be mentioned those which are conventionally used, such as p-methoxyphenol, 2,6-di-tert-butyl-p-cresol, triphenyl phosphite and the like.

The photosensitive resin composition to be used in the present invention is liquid at room temperature. The viscosity of a photosensitive resin composition to be used in the production of a printing plate for use in printing a corrugated board is preferably 200 to 700 poises, more preferably 300 to 600 poises at 20° C. as measured by a rotational viscometer. Such a degree of viscosity is advantageous from the viewpoints of ease in handling, ease in molding into a sheet having an even thickness of 4 to 7 mm, and ease in development with an aqueous developer.

If a solid photosensitive resin composition is used to produce a printing plate having a hardness suitable for printing a corrugated board, the use of high molecular weight polymers is required and, therefore, it is difficult to develop an exposed resin composition by the use of an aqueous developer, so that it is necessary to use an organic solvent as a developer. The use of an organic solvent leads not only to a poor working atmosphere and the danger of fire but also to the following disadvantage. That is, when a printing plate in which the plate thickness is 4 to 7 mm and the distance between the top of the convex portions and the bottom of the concave portions is no less than 3 to 6 mm is produced by the use of an organic solvent, the organic solvent causes the swell of the relief image portion of the printing plate, thereby deforming the relief image. Therefore, it is difficult to produce a printing plate suitable for printing a corrugated board from a solid photosensitive resin composition.

The preparation of the photoresin printing plate of the present invention from the above-mentioned photosensitive resin composition can be effected by a customary method. That is, the photoresin printing plate of the present invention can be obtained by providing a photosensitive resin layer of the above-mentioned photosensitive resin composition on a substrate and subjecting the layer to image-wise exposure to actinic radiation, followed by the development thereof.

As the aqueous developer, there may be employed aqueous solutions of an alkaline agent such as a surfactant, sodium borate, sodium hydroxide or the like, solely or in combinations. As such a surfactant to be used as a developer, there may be employed a nonionic surfactant such as polyoxyalkylene glycol nonylphenyl ether or an anionic surfactant such as sodium alkylbenzene sulfonate, solely or in combinations. When these agents are used in combination, the proportions of the respective agents can be appropriately selected according to the composition of the photosensitive resin to be subjected to development. The concentration of the surfactant in an aqueous developer is not limited, but is generally in the range of from 0.5 to 4% by weight.

With respect to the developing technique, spray developing is generally employed except in some cases brush developing is used. In producing the photoresin printing plate of the present invention, it is necessary to employ a photosensitive resin composition such that the cured product obtained therefrom has a Shore A hardness of 25 to 60 at 20° C. and an impact resilience of 35% or more at 20° C. as measured by the falling ball method. In this connection, in many cases, a printing plate prepared from such a photosensitive resin composition has a surface tack of more than 40 g/cm. In these cases, it is necessary that the surface tack of the printing plate be reduced to 40 g/cm or less, for example, by impregnating the cured photosensitive resin composition layer with a hydrogen-abstracting agent which is capable of abstracting a hydrogen atom under irradiation with actinic rays. The impregnation may be performed by, e.g., dipping the cured photosensitive composition layer in an ethanol solution containing 1 to 4% of a hydrogen-abstracting agent for 1 to 10 min, and then irradiating said layer with actinic rays (see U.S. Pat. No. 4,202,696). As such a hydrogen-abstracting agent, there may be mentioned benzophenone, 4,4'-dimethoxybenzophenone, 4-hydroxybenzophenone, deoxybenzophenone, acetophenone, 4-methylacetophenone, anthraquinone, 2-methylanthraquinone, 2-ethylanthraquinone and the like.

With respect to the actinic rays to be used in preparing a printing plate of the present invention, those having wave lengths in the range of 300 nm or less, particularly 200 to 300 nm, are preferred. As the source of such actinic rays, there may be mentioned a low pressure mercury lamp, a germicidal lamp, a heavy hydrogen lamp or the like.

As the method of impregnating the cured resin layer with the above-mentioned hydrogen-abstracting agent, there may be mentioned, for example, a method wherein a treating solution prepared by dissolving a hydrogen-abstracting agent in an appropriate solvent is applied to the cured photosensitive resin layer by brushing or spraying, and a method wherein the cured resin layer is immersed in such a treating solution.

The thickness of the photoresin printing plate of the present invention is preferably in the range of from 3 to 8 mm. The photoresin printing plate of the present invention is used with a substrate being attached thereto. Such a substrate may be the substrate which was used in the preparation of the printing plate. Alternatively, the substrate which was used in the preparation of the printing plate may be replaced by another substrate such as a polyester film or a rubber plate.

The photoresin printing plate of the present invention has a Shore A hardness, impact resilience and surface tack respectively in specific ranges. In the printing operation using the printing plate of the present invention, paper dust or the like, which has adhered to the surface of the printing plate readily releases during the short period of time in which only several corrugated boards have been printed, thereby eliminating the necessity of interrupting the printing operation in order to clean the printing plate. Thus, printing on corrugated boards can be efficiently conducted while providing a sharp and fine image having a uniform ink coating.

The present invention will now be described in detail with reference to the following Examples and Comparative Examples.

EXAMPLE 1

To a mixture of 1 mol of polypropylene glycol diol (number average molecular weight:2000) and 1 mol of polytetramethylene glycol diol (number average molecular weight:2000) were added 2.4 mols of tolylene diisocyanate and dibutyltin dilaurate at a concentration of 20 ppm, and the resulting mixture was reacted at 80° C. for 2 hours to obtain a urethane polymer having isocyanate groups at both terminals of the molecule. To this urethane polymer were added 2 mols of polypropylene glycol monomethacrylate (molecular weight:380) and the resulting mixture was reacted until the absorption peak ascribed to an isocyanate group (around 2260 cm$^{-1}$) was hardly observed on an infrared absorption spectrum, to prepare an unsaturated polyurethane prepolymer.

To 70 parts by weight of this prepolymer were added 18 parts by weight of lauryl methacrylate, 12 parts by weight of tetraethylene glycol monomethylether monomethacrylate, 1.5 parts by weight of tetraethylene glycol dimethacrylate, 1 part by weight of trimethylolpropane trimethacrylate, 0.7 part by weight of 2,2-dimethoxy-2-phenylacetophenone and 0.5 part by weight of 2,6-di-t-butyl-p-cresol, and the resulting mixture was agitated, to obtain a photosensitive resin composition.

Using Exposure Unit Type ALF (an exposure equipment manufactured and sold by Asahi Kasei Kogyo K. K., Japan), a 7 mm-thick layer of the thus-prepared photosensitive resin composition which layer was formed on a base film was subjected to image-wise exposure (masking exposure:5 min, relief exposure:4 min, back exposure: 40 seconds), followed by the removal of the uncured portions of the resin by spraying thereon an aqueous solution containing 3% by weight of APR Wash Out Agent W-7(trade name of a nonionic surface active agent manufactured and sold by Asahi Kasei Kogyo K. K., Japan) at 40° C. to obtain a plate. (Masking exposure: exposure from the side of the substrate through a masking film having a transparent pattern which is about 10 mm wider than the relief image, in order to cure the basement of the relief. Relief exposure: exposure through an image-bearing negative film, in order to form the relief. Back exposure: exposure, after removing the masking film, from the side of the basement of the relief for the entire area of the plate, in order to fix the relief including the basement to the base film.) Then the thus-obtained plate was immersed in water, and exposed to actinic rays having an intensity of 2 mW/m$^2$, emitted from Toshiba Chemical Lamp FLR-20S/M (trade name of a chemical lamp manufactured and sold by Toshiba Corporation, Japan) for 10 min (post-exposure for completely curing the relief portion) and dried at 60° C. for 15 min. Further, this plate was immersed in a 2% ethanol solution of benzophenone for 2 min and then air-dried for 30 min, followed by exposure to actinic rays emitted from Toshiba Germicidal Lamp GL-15 (trade name of a germicidal lamp manufactured and sold by Toshiba Corporation, Japan) for 10 min.

With respect to the resulting printing plate, the surface tack was 0 g/cm at 20° C., the impact resilience was 35% at 20° C. as measured by the falling ball method, and the Shore A hardness was 49 at 20° C.

Using the thus-prepared printing plate and Flexoink FK-88 (trade name of a water ink manufactured by Sakata Shokai Ltd., Japan), printing on corrugated boards were conducted. Inking on the plate was good and during the printing operation, paper dust or the like which has adhered to the printing plate readily released during the short period of time in which only several boards were printed. Therefore, it did not become necessary to interrupt the printing operation in order to clean the plate, in the printing of a total of 30,000 corrugated boards.

COMPARATIVE EXAMPLE 1

A printing plate was prepared from the photosensitive resin composition obtained in Example 1 in substantially the same manner as in Example 1 except that immersion in the 2% ethanol solution of benzophenone and the subsequent exposure to actinic rays from the germicidal lamp were omitted.

The resulting printing plate had a surface tack at 20° C. of 200 g/cm, an impact resilience at 20° C. of 35% as measured by the falling ball method and a Shore A hardness at 20° C. of 49.

Using this printing plate and the same water ink as used in Example 1, printing on corrugated boards was conducted. In this case, paper dust or the like, which has adhered to the printing plate did not self-release during the printing and, therefore, it became necessary to interrupt the printing operation in order to clean the printing plate, after about 1000 corrugated boards have been printed.

COMPARATIVE EXAMPLE 2

To a mixture of 1 mol of polypropylene glycol adipate diol (number average molecular weight: 2000) and 1 mol of polypropylene glycol diol (number average molecular weight:2000) were added 2.4 mols of tolylene diisocyanate and dibutyltin dilaurate to a final concentration of 70 ppm and the reaction was effected at 80° C. for 2 hours to obtain a urethane polymer having isocyanate groups at both terminals of the molecule.

To this urethane polymer was added 1 mol of polypropylene glycol monomethacrylate (number average molecular weight:380) and the reaction was conducted until the absorption peak ascribed to an isocyanate group (around 2260 cm$^{-1}$) was hardly observed on an infrared absorption spectrum, to obtain an unsaturated polyurethane prepolymer.

To 70 parts by weight of the thus obtained prepolymer were added 18 parts by weight of lauryl methacrylate, 12 parts by weight of tetraethylene glycol monomethylether monomethacrylate, 1.5 parts by weight of tetraethylene glycol dimethacrylate, 1 part by weight of trimethylolpropane trimethacrylate, 0.7 part by weight of 2,2-dimethoxy-2-phenylacetophenone, 0.5 part by weight of 2,6-di-t-butyl-p-cresol and the mixture was agitated, to obtain a photosensitive resin composition.

A printing plate was prepared from this photosensitive resin composition in the same manner as in Example 1 including the impregnation with the hydrogen-abstracting agent and exposure to actinic rays from the germicidal lamp.

The resulting plate had a surface tack at 20° C. of 0 g/cm, an impact resilience at 20° C. of 25% as measured by the falling ball method and a Shore A hardness at 20° C. of 48.

Using this printing plate and the same water ink as used in Example 1, printing on corrugated boards was conducted. In this case, paper dust or the like, which has adhered to the printing plate did not self-release during the printing and, therefore, it became necessary to interrupt the printing operation in order to clean the printing plate, after about 1000 corrugated boards have been printed.

EXAMPLE 2

To 70 parts by weight of the unsaturated polyurethane prepolymer as obtained in Example 1 were added 18 parts by weight of polypropylene glycol monomethacrylate (number average molecular weight:800), 12 parts by weight of tetraethylene glycol monomethylether monomethacrylate, 1.5 part by weight of tetraethylene glycol dimethacrylate, 1 part by weight of trimethylolpropane trimethacrylate, 0.7 part by weight of 2,2-dimethoxy-2-phenylacetophenone, 3 parts by weight of acetophenone and 0.1 part by weight of 2,6-di-t-butyl-p-cresol, and the resulting mixture was stirred, to obtain a photosensitive resin composition.

The thus obtained photosensitive resin composition was subjected to image-wise exposure and washing-out of the unexposed portions in the same manner as in Example 1 to obtain a plate. Subsequently, using Post Exposure Unit Type ALF 200UP (a post-exposure apparatus manufactured and sold by Asahi Kasei Kogyo K. K., Japan), the plate was subjected to post-exposure in water to actinic rays emitted from the chemical lamp and simultaneously to actinic rays emitted from the germicidal lamp for 10 min, followed by drying at 60° C. for 15 min.

The resulting printing plate had a surface tack at 20° C. of 40 g/cm, an impact resilience at 20° C. of 43% as measured by the falling ball method and a Shore A hardness at 20° C. of 48.

Using the thus prepared printing plate and the same water ink as used in Example 1, printing on corrugated boards was conducted. During the printing operation, paper dust or the like, which has adhered to the printing plate readily released during the short period of time in which only several boards were printed. Therefore, it did not become necessary to interrupt the printing operation in order to clean the plate, in the printing of a total of 40,000 corrugated boards.

EXAMPLE 3

To 2 mols of polyethylene glycol-polypropylene glycol-polyethylene glycol block diol (block ratio:15/70/15, number average molecular weight:2500) were added 1.7 mols of adipic acid, 0.1% by weight of t-butyl catechol and 0.5% by weight of p-toluenesulfonic acid, and dehydration/condensation reaction was effected at 200° C. for 2 hours, followed by reaction under reduced pressure (150 mm for 1 hour, 50 mm for 1 hour) to obtain a polyester having OH groups at both terminals of the molecule. To this polyester were added 0.6 mol of methacrylate chloride and 0.01% by weight of pyridine, and the reaction was conducted at 120° C. to obtain an unsaturated polyester having methacrylate groups at both terminals of the molecule.

To 100 parts by weight of this prepolymer were added 18 parts by weight of lauryl methacrylate, 18 parts by weight of polypropylene glycol monomethacrylate (number average molecular weight:800), 5 parts by weight of tetraethylene glycol diacrylate, 1.5 parts by weight of 2,2-dimethoxy-2-phenylacetophenone and 0.1 part by weight of 2,6-di-t-butyl-p-cresol, and the resulting mixture was agitated to obtain a liquid photosensitive resin composition.

A printing plate was prepared from this liquid photosensitive resin composition in the same manner and under the same conditions as in Example 1.

The thus-obtained plate had a surface tack at 20° C. of 0 g/cm, an impact resilience at 20° C. of 40% as measured by the falling ball method and a shore A hardness at 20° C. of 55.

Using the thus-prepared printing plate and the same water ink as used in Example 1, printing on corrugated boards was conducted. During the printing operation, paper dust or the like, which has adhered to the printing plate readily released during the short period of time in which only several boards were printed. Therefore, it did not become necessary to interrupt the printing operation in order to clean the plate in printing of a total of 30,000 corrugated boards.

EXAMPLE 4

To 1 mol of poly (oxypropylene/oxyethylene) random copolymer (weight ratio of oxypropylene/oxyethylene:80/20, number average molecular weight:2500) and 1 mol of polytetramethylene glycol (number average molecular weight:1200) were added 2.4 mols of toluylene diisocyanate, and the reaction was conducted at 80° C. for 2 hours to obtain an urethane polymer having isocyanate groups at both terminals of the molecule. To this urethane polymer were added 2 mols of polypropylene glycol monomethacrylate (number average molecular weight:800) and the reaction was conducted until the absorption peak ascribed to an isocyanate group (around 2260 cm$^{-1}$) was hardly observed on an infrared absorption spectrum, to obtain an unsaturated polyurethane prepolymer.

To 70 parts by weight of this prepolymer were added 9 parts by weight of lauryl methacrylate, 10 parts by weight of tridecyl methacrylate, 12 parts by weight of tetraethylene glycol monomethylether monoacrylate, 1.5 parts by weight of diethylene glycol diacrylate, 1.7 parts by weight of 2,2-dimethoxy-2-phenylacetophenone and 0.05 parts by weight of 2,6-di-t-butyl-p-cresol, and the resulting mixture was agitated to obtain a photosensitive resin composition.

A printing plate was prepared from this photosensitive resin composition in the same manner as in Example 2.

The thus-obtained printing plate had a surface tack at 20° C. of 35 g/cm, an impact resilience at 20° C. of 45% as measured by the falling ball method and a Shore A hardness at 20° C. of 46.

Using this printing plate and the same water ink as used in Example 1, printing on corrugated boards was conducted. During the printing, paper dust or the like, which has adhered to the printing plate readily released during the short period of time in which only several boards were printed. Therefore, it did not become necessary to interrupt the printing operation in order to clean the plate, in the printing of a total of 20,000 corrugated boards.

EXAMPLE 5

Various photosensitive resin compositions as shown in Table 1 were prepared using the unsaturated polyurethane prepolymer obtained in Example 1. Printing plates were prepared from these photosensitive resin compositions in the same manner as in Example 1 and the properties of these printing plates were examined. The results are shown in Table 1.

TABLE 1

| Prepolymer | LMA | TEG MM | PPM | PPA | SMA | HPM | TEG DMA | TMPT | DMPAP | BHT | Impact Resilience[1] | Shore A Hardness | Surface Tack |
|---|---|---|---|---|---|---|---|---|---|---|---|---|---|
| 70 | 18 | 12 | — | — | — | — | 1.5 | 1 | 0.7 | 0.5 | 35 | 49 | 0 |
| 85 | 9 | 6 | — | — | — | — | 0.8 | 0.5 | 0.7 | 0.5 | 40 | 49 | 0 |
| 60 | 18 | 12 | — | 10 | — | — | 1.5 | 1 | 0.7 | 0.5 | 43 | 47 | 0 |
| 70 | 9 | 12 | 9 | — | — | — | 1.5 | 1 | 0.7 | 0.5 | 35 | 53 | 0 |
| 70 | 9 | 12 | — | 9 | — | — | 1.5 | 1 | 0.7 | 0.5 | 43 | 47 | 0 |
| 70 | 9 | 12 | — | — | 9 | — | 1.5 | 1 | 0.7 | 0.5 | 39 | 51 | 0 |

TABLE 1-continued

| Pre-polymer | LMA | TEG MM | PPM | PPA | SMA | HPM | TEG DMA | TMPT | DMPAP | BHT | Impact Resilience[1] | Shore A Hardness | Surface Tack |
|---|---|---|---|---|---|---|---|---|---|---|---|---|---|
| 70 | 13 | 12 | — | 5 | — | 5 | 1.5 | 1 | 0.7 | 0.5 | 37 | 51 | 0 |

LMA: lauryl methacrylate
TEGMM: tetraethylene glycol monomethacrylate monomethylether
PPM: polypropylene glycol monomethacrylate (number average molecular weight 380)
PPA: polypropylene glycol monoacrylate (number average molecular weight 370)
SMA: stearyl methacrylate
HPM: hydroxypropyl methacrylate
TEGDMA: tetraethylene glycol dimethacrylate
TMPT: trimethylolpropane trimethacrylate
DMPAP: 2,2-dimethoxy-2-phenylacetophenone
BHT: 2,6-di-t-butyl-p-cresol
Note
[1]impact resilience as measured by a falling ball method

EXAMPLE 6

Unsaturated polyurethane prepolymers were obtained in substantially the same manner as in Example 1 except that the ratio of the diol to the diisocyanate was varied to give prepolymers having different number average molecular weights as shown in Table 2.

Using these prepolymers, photosensitive resin compositions were obtained in the same manner as in Example 1, and printing plates were obtained therefrom in the same manner as in Example 1. The properties of these printing plates were examined and the results are shown in Table 2.

TABLE 2

| Number average molecular weight of the pre-polymer used | Impact resilience as measured by a falling ball method (%) | Shore A hardness | Surface tack (g/cm) |
|---|---|---|---|
| 16000 | 36 | 48 | 0 |
| 14000 | 35 | 49 | 0 |
| 10000 | 35 | 52 | 0 |
| 5000 | 35 | 63 | 0 |

EXAMPLE 7 AND COMPARATIVE EXAMPLE 3

Using 2 mols of each of various polyether diol mixtures which were prepared by mixing polyethylene glycol-polypropylene glycol-polyethylene glycol block copolymer diol (number average molecular weight:2500, block weight ratio:15/70/15) and polytetramethylene glycol (number average molecular weight:2000)(PTMG) in various proportions as shown in Table 3, 2.4 mols of toluylene diisocyanate, 1 mol of polypropylene glycol monomethacrylate and 1 mol of 2-hydroxypropyl methacrylate, there were obtained unsaturated polyurethane prepolymers in the same manner as in Example 1.

To 70 parts by weight of each of the prepolymers were added 12 parts by weight of tetraethylene glycol monomethylether monomethacrylate, 9 parts by weight of polypropylene glycol monomethacrylate (number average molecular weight:800), 9 parts by weight of lauryl methacrylate, 3 parts by weight of ethylene glycol monoacrylate mono-2-ethylhexylether, 1.5 parts by weight of tetraethylene glycol dimethacrylate, 1 part by weight of trimethylolpropane trimethacrylate, 0.7 part by weight of 2,2-dimethoxy-2-phenylacetophenone, 0.1 part by weight of 2,6-di-t-butyl-p-cresol and 1 part by weight of dimyristyl thiodipropionate, and the resulting mixtures were separately agitated to obtain photosensitive resin compositions.

Printing plates were separately prepared from the thus obtained photosensitive resin compositions in the same manner as in Example 2. The properties of these printing plates were examined and the results are shown in Table 3.

A spacer of 1 mm in thickness was inserted between two transparent glass sheets facing each other, each 5 mm in thickness and covered with a 12 μ-thick polyester film, to form a cavity. Each of the above-mentioned photosensitive resin compositions was separately into the cavity, to form a resin layer. The thus formed layers were separately exposed from one side to actinic rays having an intensity of 1 mW/cm$^2$ which were emitted from an ultraviolet fluorescent tube for 15 min and then from the other side for 15 mm, to obtain 1 mm-thick sheets of the cured resin. The resulting sheets were cut into pieces having a size of 1 cm×5 cm and the cut sheets were immersed in water for 24 hours, followed by measurement of the weight gain. The results of the measurement are shown in Table 3.

TABLE 3

| Proportion of PTMG in polyether diol mixture (wt %) | Impact resilience as measured by a falling ball method (%) | Shore A hardness | Surface tack (g/cm) | Swell after 24-hour immersion (wt %) |
|---|---|---|---|---|
| 50 | 40 | 48 | 0 | 7 |
| 35 | 38 | 47 | 0 | 10 |
| 20 | 36 | 46 | 0 | 18 |
| 0[2] | 30 | 46 | 0 | 35 |

Note:
[1]PTMG: polytetramethylene glycol
[2]Comparative Example 3

EXAMPLE 8

Using 1 mol of polypropylene glycol (number average molecular weight:2000), 1 mol of polyethylene glycol-polypropylene glycol-polyethylene glycol block copolymer diol (number average molecular weight:2000, block weight ratio:10/80/10), 2.5 mols of toluylene diisocyanate, 1 mol of polypropylene glycol monomethacrylate and 1 mol of 2-hydroxypropyl methacrylate, there was obtained an unsaturated polyurethane prepolymer in the same manner as in Example 1.

To 75 parts by weight of the prepolymer were added 10 parts by weight of lauryl methacrylate, 10 parts by weight of polypropylene glycol monoacrylate (number average molecular weight:800), 2 parts by weight of tetraethylene glycol diacrylate, 1.5 parts by weight of trimethylolpropane trimethacrylate, 1 part by weight of 2,2-dimethoxy-2-phenylacetophenone, 0.1 part by weight of 2,6-di-t-butyl-p-cresol, 1 part by weight of myristic acid and 1.3 parts by weight of dimyristyl thiodipropionate, and the resulting mixture was agitated to obtain a photosensitive resin composition.

A printing plate was prepared from the thus obtained photosensitive resin composition in the same manner as in Example 2. The properties of this printing plate were examined. As a result, it was found that the printing plate had a Shore A hardness of 44 at 20° C., an impact resilience of 43% at 20° C. as measured by the falling ball method and a surface tack of 0 g/cm at 20° C.

What is claimed is:

1. A photoresin printing plate for use in printing a corrugated board, having a Shore A hardness at 20° C. of 25 to 60, an impact resilience at 20° C. of 35% or more as measured by a falling ball method and a surface tack at 20° C. of 40 g/cm or less, said printing plate being prepared by providing a photosensitive resin layer of a liquid photosensitive resin composition on a substrate and subjecting the layer to image-wise exposure to actinic radiation, followed by the development thereof, wherein said liquid photosensitive resin composition comprises (A) an unsaturated polyurethane prepolymer, (B) an ethylenically unsaturated compound and (C) a photopolymerization initiator, said unsaturated polyurethane prepolymer being obtained by the reaction of a diol having a number average molecular weight of 700 to 5,000 with a compound having at least two isocyanate groups and a compound containing in the molecule thereof at least one functional group having an active hydrogen atom and at least one ethylenically unsaturated double bond, said diol consisting of a polyether diol comprising at least 20% by weight, based on the total weight of the polyether diol, of polytetramethylene glycol.

2. The printing plate according to claim 1, wherein said polyether diol comprises at least 20% by weight, based on the total weight of the polyether diol, of polytetramethylene glycol and 5 to 30% by weight, based on the total weight of the polyether diol, of polyethylene glycol.

3. The printing plate according to claim 1, wherein said unsaturated polyurethane prepolymer has a number average molecular weight of 8000 to 20,000.

4. The printing plate according to claims 1 or 2, wherein said ethylenically unsaturated compound is a mixture of a compound having one ethylenically unsaturated double bond in the molecule and a compound having at least two ethylenically unsaturated double bonds in the molecule.

5. The printing plate according to claim 4, wherein the proportion of said compound having at least two ethylenically unsaturated double bonds in the molecule is 1 to 20% by weight based on the total weight of the mixture.

6. The printing plate according to claims 1 or 2, wherein at least a portion of said ethylenically unsaturated compound is an acrylate.

7. The printing plate according to claim 1, wherein the Shore A hardness is 35 to 50.

8. The printing plate according to claim 1, wherein the diol has a number average molecular weight of 1,000 to 2,500.

9. The printing plate according to claim 1, wherein the photosensitive resin composition is liquid at room temperature.

10. A method for printing a corrugate board, which comprises printing a corrugate board by means of a photoresin printing plate having a Shore A hardness at 20° C. of 25 to 60, an impact resilience at 20° C. of 35% or more as measured by a falling ball method and a surface tack at 20° C. of 40 g/cm or less, said printing plate being prepared by providing a photosensitive resin layer of a liquid photosensitive resin composition on a substrate and subjecting the layer to image-wise exposure to actinic radiation, followed by the development thereof, wherein said liquid photosensitive resin composition comprises (A) an unsaturated polyurethane prepolymer, (B) an ethylenically unsaturated compound and (C) a photopolymerization initiator, said unsaturated polyurethane prepolymer being obtained by the reaction of a diol having a number average molecular weight of 700 to 5,000 with a compound having at least two isocyanate groups and a compound containing in the molecule thereof at least one functional group having an active hydrogen atom and at least one ethylenically unsaturated double bond, said diol consisting of a polyether diol comprising at least 20% by weight, based on the total weight of the polyether diol, of polytetramethylene glycol.

11. The method according to claim 10, wherein said polyether diol comprises at least 20% weight, based on the total weight of the polyether diol, of polytetramethylene glycol and 5 to 30% by weight, based on the total weight of the polyether diol, of polyethylene glycol.

12. The method according to claim 10, wherein said unsaturated polyurethane prepolymer has a number average molecular weight of 8000 to 20,000.

13. The method according to claims 10 or 11, wherein said ethylenically unsaturated compound is a mixture of a compound having one ethylenically unsaturated double bond in the molecule and a compound having at least two ethylenically unsaturated double bonds in the molecule.

14. The method according to claim 13, wherein the proportion of said compound having at least two ethylenically unsaturated double bonds in the molecule is 1 to 20% by weight based on the total weight of the mixture.

15. The method according to claims 10 or 11, wherein at least a portion of said ethylenically unsaturated compound is an acrylate.

16. The method according to claim 10, wherein the Shore A hardness is 35 to 50.

17. The method according to claim 10, wherein the diol has a number average molecular weight of 1,000 to 2,500.

18. The method according to claim 10, wherein the photosensitive resin composition is liquid at room temperature.

19. A method for printing a corrugated board, which comprises printing a corrugated board by means of a photoresin printing plate having a Shore A hardness at 20° C. of 25 to 60, an impact resilience at 20° C. of 35% or more as measured by a falling ball method and a surface tack at 20° C. of 40 g/cm or less, said printing plate being prepared by providing a photosensitive resin layer of a liquid photosensitive resin composition on a substrate and subjecting the layer to image-wise exposure to actinic radiation, followed by the development thereof, wherein said liquid photosensitive resin composition comprises (A) an unsaturated polyurethane prepolymer, (B) an ethylenically unsaturated compound and (C) a photopolymerization initiator, said unsaturated polyurethane prepolymer being obtained by the reaction of a diol having a number average molecular weight of 700 to 5,000 with a compound having at least two isocyanate groups and a compound containing in the molecule thereof at least one functional group having an active hydrogen atom and at least one ethylenically unsaturated double bond, said diol consisting essentially of a polyether diol comprising at least 20% by weight, based on the total weight of the polyether diol, of polytetramethylene glycol having a molecular weight 700–5,000.

20. A photoresin printing plate for use in printing a corrugated board, having a Shore A hardness at 20° C. of 25 to 60, an impact resilience at 20° C. of 35% or more as measured by a falling ball method and a surface tack at 20° C. of 40 g/cm or less, said printing plate being prepared by providing a photosensitive resin layer of a liquid photosensitive resin composition on a substrate and subjecting the layer to image-wise exposure to actinic radiation, followed by the development thereof, wherein said liquid photosensitive resin composition comprises (A) an unsaturated polyurethane prepolymer, (B) an ethylenically unsaturated compound and (C) a photopolymerization initiator, said unsaturated polyurethane prepolymer being obtained by the reaction of a diol having a number average molecular weight of 700 to 5,000 with a compound having at least two isocyanate groups and a compound containing in the molecule thereof at least one functional group having an active hydrogen atom and at least one ethylenically unsaturated double bond, said diol comprising at least 20% by weight, based on the total weight of the diol, of polytetramethylene glycol having a molecular weight of 700 to 5,000.

21. A photoresin printing plate for use in printing a corrugated board, having a Shore A hardness at 20° C. of 25 to 60, an impact resilience at 20° C. of 35% or more as measured by a falling ball method and a surface tack at 20° C. of 40 g/cm or less, said printing plate being prepared by providing a photosensitive resin layer of a liquid photosensitive resin composition on a substrate and subjecting the layer to image-wise exposure to actinic radiation, followed by the development thereof, wherein said liquid photosensitive resin composition consists essentially of (A) an unsaturated polyurethane prepolymer, (B) an ethylenically unsaturated compound and (C) a photopolymerization initiator, said unsaturated polyurethane prepolymer being obtained by the reaction of a diol having a number average molecular weight of 700 to 5,000 with a compound having at least two isocyanate groups and a compound containing in the molecule thereof at least one functional group having an active hydrogen atom and at least one ethylenically unsaturated double bond, said diol comprising at least 20% by weight, based on the total weight of the diol, of polytetramethylene glycol having a molecular weight of 700 to 5,000.

* * * * *